(12) United States Patent
Gedamu et al.

(10) Patent No.: US 6,940,718 B2
(45) Date of Patent: Sep. 6, 2005

(54) HEAT DISSIPATION APPARATUS AND METHOD

(75) Inventors: Elias Gedamu, Calgary (CA); Denise Man, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 113 days.

(21) Appl. No.: 10/649,551

(22) Filed: Aug. 27, 2003

(65) Prior Publication Data

US 2005/0047105 A1 Mar. 3, 2005

(51) Int. Cl.[7] ................................................. H05K 7/20
(52) U.S. Cl. ..................... 361/695; 361/690; 361/694; 257/722; 174/16.3; 165/104.33
(58) Field of Search ................................ 361/688–690, 361/694, 695, 697–699, 707, 709, 711; 257/706, 707, 712, 721, 722; 174/16.1, 16.3; 165/80.3, 80.4, 104.33

(56) References Cited

U.S. PATENT DOCUMENTS

| | | | | |
|---|---|---|---|---|
| 5,158,136 A | * | 10/1992 | Azar | 165/185 |
| 5,239,443 A | * | 8/1993 | Fahey et al. | 361/689 |
| 5,351,748 A | * | 10/1994 | Dagan | 165/80.3 |
| 5,583,316 A | * | 12/1996 | Kitahara et al. | 174/16.3 |
| 5,781,411 A | | 7/1998 | Feenstra | |
| 6,410,982 B1 | * | 6/2002 | Brownell et al. | 257/714 |
| 6,490,160 B2 | * | 12/2002 | Dibene et al. | 361/700 |
| 6,666,260 B2 | * | 12/2003 | Tantoush | 165/80.3 |
| 6,817,405 B2 | * | 11/2004 | Kamath et al. | 165/80.3 |
| 6,820,684 B1 | * | 11/2004 | Chu et al. | 165/104.33 |
| 2002/0149912 A1 | | 10/2002 | Chu | |

FOREIGN PATENT DOCUMENTS

| | | |
|---|---|---|
| DE | 4402918 A1 | 8/1995 |
| JP | 09017920 A | 1/1997 |

* cited by examiner

*Primary Examiner*—Boris Chervinsky

(57) ABSTRACT

Disclosed are a heat dissipation computer and method. In one embodiment, a heat dissipation apparatus comprises a heat sink that is adapted to receive a processor mounted thereto, the heat sink comprising an internal chamber that is adapted to receive a fluid flow that removes heat from the heat sink. In one embodiment, a method for dissipating heat generated by a processor comprises forcing fluid through an internal chamber formed within a heat sink to which the processor is mounted, forcing the fluid from the internal chamber of the heat sink through at least one hollow prong that extends from the heat sink and that is in fluid communication with the internal chamber of the heat sink, and forcing fluid over exterior surfaces of the at least one hollow prong.

31 Claims, 5 Drawing Sheets

HEAT DISSIPATION APPARATUS AND METHOD

BACKGROUND

Computers comprise one or more processors, such as microprocessors, that generate heat during use. To avoid overheating a processor, which can cause computer failure, processors are often mounted to heat sinks that draw heat away from the processor. Normally, such heat sinks are cooled via forced convection through the use of one or more fans provided within the computer "box." The airflow created by such fans transfers heat from the processor to the ambient air.

A typical heat sink comprises a relatively thin plate of metal to which the processor is mounted. The dimensions of the heat sink depend upon the particular configuration and operation of the processor. By way of example, the heat sink may comprise length and width dimensions of about 6 inches by 3 inches. Although such dimensions are not particularly large in an absolute sense, the dimensions can be a significant factor in terms of computer design, especially when the computer being designed comprises multiple processors. For instance, a server computer may include ten or more such processors, each of which requiring its own heat sink to dissipate heat. In such a case, it may be difficult to fit all of the processors, and their associated heat sinks, within the computer box. Furthermore, the aggregate weight of the heat sinks may increase the weight of the computer as well as the cost of shipping the processors.

Although it would be desirable to decrease the size of the processor heat sinks to avoid the above-described problems, simple size reduction can result in inadequate heat dissipation and, therefore, computer failure. Accordingly, needed is a heat dissipation apparatus and method with which adequate heat transfer can be obtained with more compact and/or lighter apparatus.

SUMMARY

Disclosed are a heat dissipation apparatus and method. In one embodiment, a heat dissipation apparatus comprises a heat sink that is adapted to receive a processor mounted thereto, the heat sink comprising an internal chamber that is adapted to receive a fluid flow that removes heat from the heat sink.

In one embodiment, a method for dissipating heat generated by a processor comprises forcing fluid through an internal chamber formed within a heat sink to which the processor is mounted, forcing the fluid from the internal chamber of the heat sink through at least one hollow prong that extends from the heat sink and that is in fluid communication with the internal chamber of the heat sink, and forcing fluid over exterior surfaces of the at least one hollow prong.

BRIEF DESCRIPTION OF THE DRAWINGS

The disclosed apparatus and method can be better understood with reference to the following drawings. The components in the drawings are not necessarily to scale.

DETAILED DESCRIPTION

As described above, the size and/or weight of conventional heat sinks used in conjunction with computer processors can be undesirable, particularly in cases in which multiple processors are to be provided in a single computer box. As is described in the following, however, adequate heat dissipation can be achieved with smaller and/or lighter heat dissipation apparatus through use of a heat dissipation apparatus that is configured to facilitate internal and external airflow in and over the heat dissipation apparatus to thereby provide greater surface area for forced convention. By way of example, the heat dissipation apparatus can comprise a heat sink that includes an internal chamber that is in fluid communication with a forced air source and hollow prongs that extend from the internal chamber. With that configuration, air can be forced through the heat sink and out through the prongs to enable an internal airflow, and air can be forced over the prongs to enable an external airflow, thereby providing adequate heat transfer with a smaller-sized heat sink.

Disclosed herein is a heat dissipation apparatus that enables such internal and external airflows, and a method for dissipating heat using internal and external airflows. Although specific embodiments are shown in the figures and are described herein, these embodiments are provided for purposes of example only to describe the apparatus and method.

Referring now in more detail to the drawings, in which like numerals indicate corresponding parts throughout the several views, FIGS. 1–5 illustrate a heat dissipating apparatus 100 that can be used to dissipate heat generated by a processor P, such as a microprocessor. As indicated in those figures, the heat dissipation apparatus 100 includes a heat sink 102, which may comprise a relatively thin plate. The heat sink 102 is constructed of a thermally-conductive material, such as a metal (e.g., aluminum). Although the heat sink 102 may comprise a single, unitary piece of material, the heat sink may, optionally, comprise a top plate 104 and a bottom plate 106 that are mounted to each other. The size and dimensions of the heat sink 102 may be selected to suit the particular application in which the heat dissipation apparatus 100 is to be used. By way of example, however, the heat sink 102 may have length and width dimensions of approximately 3 inches by 1.5 inches and, therefore, may be significantly smaller than known processor heat sinks.

Figure 1:
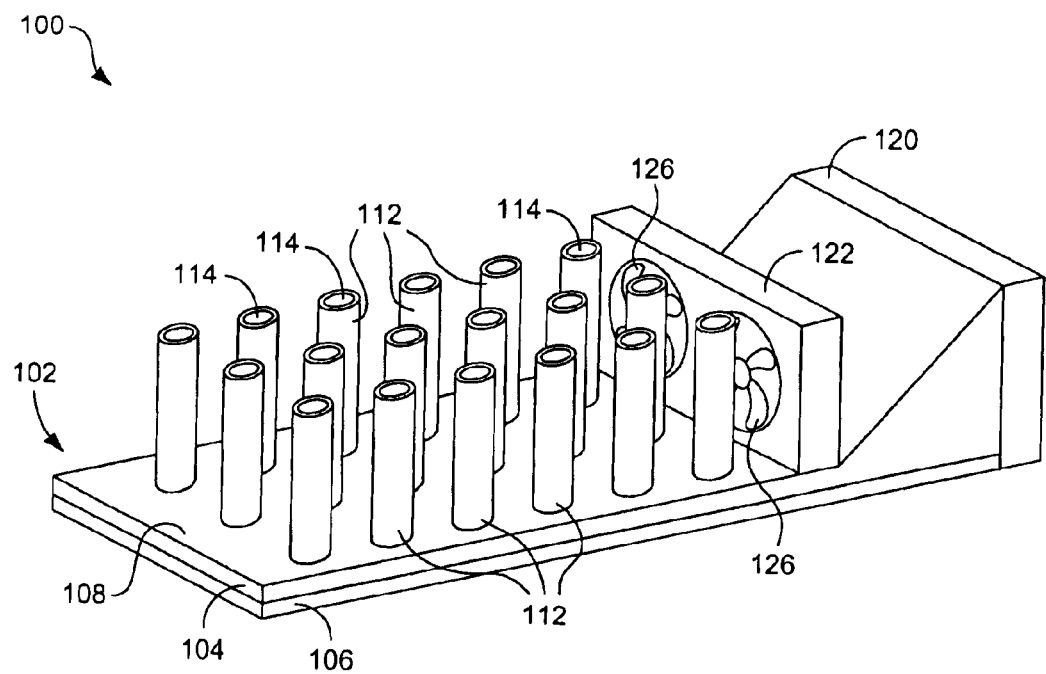
FIG. 1 is a perspective view of an example embodiment of a heat dissipation apparatus.
Figure 2:
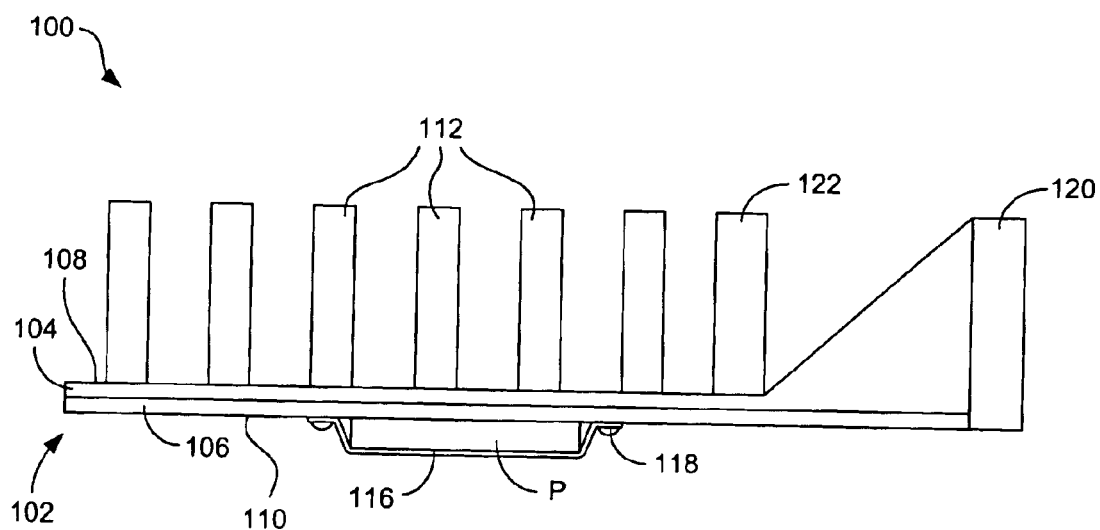
FIG. 2 is a side view of the heat dissipation apparatus of FIG. 1.
Figure 3:
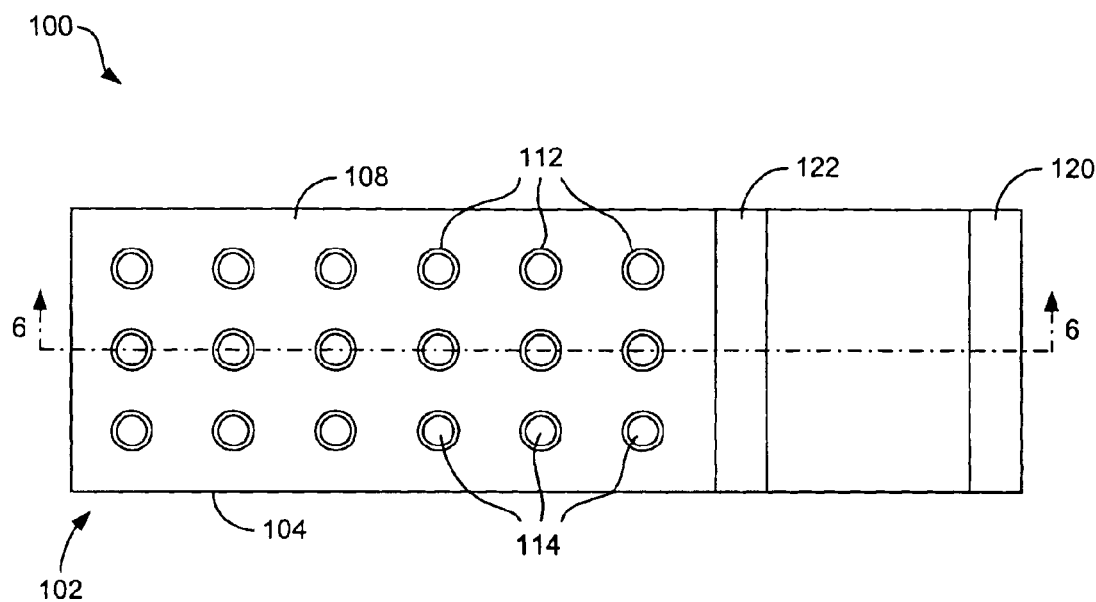
FIG. 3 is a top view of the heat dissipation apparatus of FIG. 1.
Figure 4:
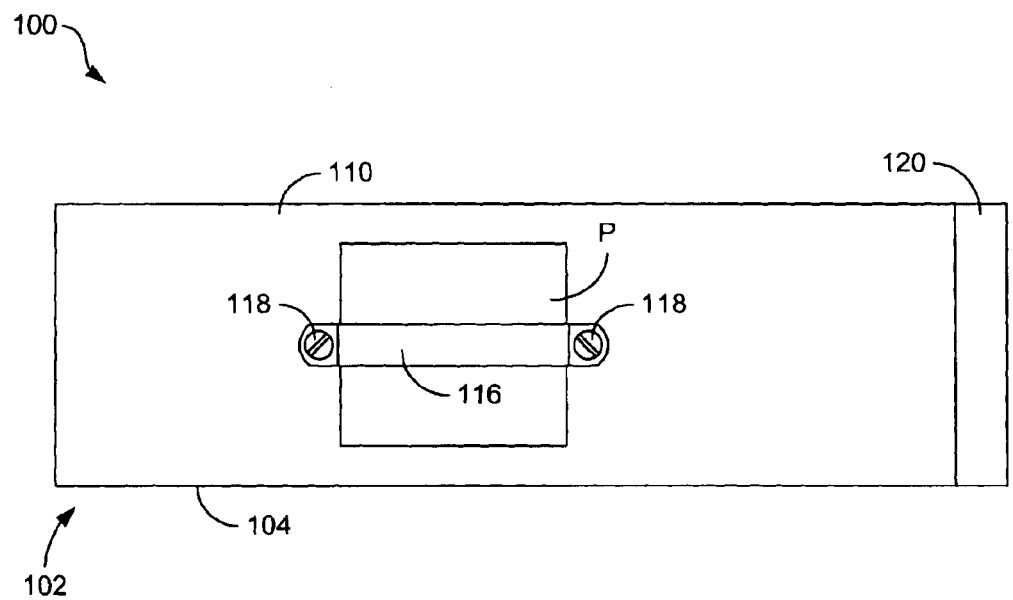
FIG. 4 is a bottom view of the heat dissipation apparatus of FIG. 1.
Figure 5:
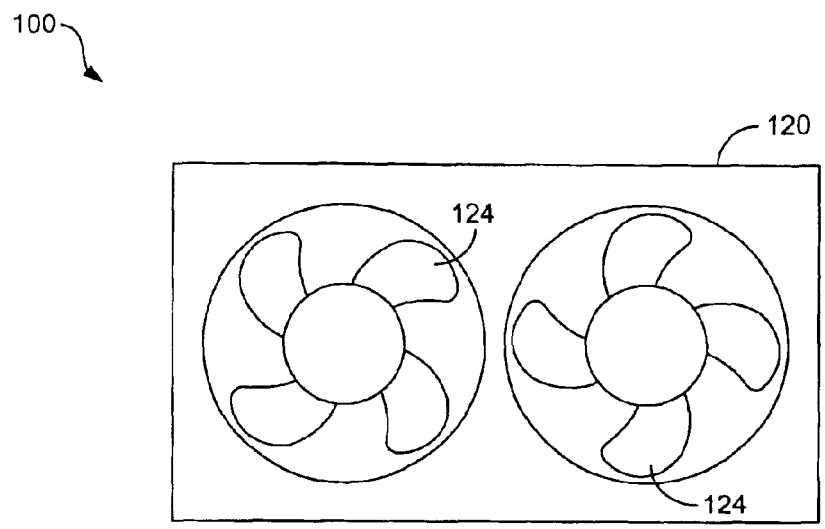
FIG. 5 is an end view of the heat dissipation apparatus of FIG. 1.

Irrespective of whether the heat sink 102 is unitary or comprises separate top and bottom plates 104 and 106, the heat sink comprises a top surface 108 and a bottom surface 110. As indicated in FIGS. 1–3, extending from the top surface 108 of the heat sink 102 are one or more hollow prongs 112 that, for example, are configured as cylindrical tubes. One or more of the prongs 112, and typically each prong, includes an internal passage 114 through which fluid, such as air, may flow to remove heat that is transmitted from the processor P to the heat sink 102 and into the prongs. The size and number of the prongs 112 may be selected to suit the particular application in which the heat dissipation apparatus 100 is used. By way of example, however, the prongs 112 may be about 1–2 inches tall and may number from about 10–30 (18 prongs are shown in the embodiment of FIGS. 1–5).

The prongs 112 are also constructed of a thermally-conductive material, such as a metal. By way of example, the prongs 112 may be unitarily-formed with the heat sink 102 (or top plate 104 where appropriate). In such a case, the heat sink 102 (e.g., top plate 104) and the prongs 112 may be manufactured (e.g., machined) from a single piece of material. Alternatively, however, the prongs 112 may be separately manufactured and then mounted to the heat sink 102, for instance by soldering, press-fitting, or gluing. As is described in greater detail below in relation to FIG. 6, the internal passages 114 of the prongs 112 are in fluid communication with an internal chamber of the heat sink 102 so as to facilitate the flow of fluid (e.g., air) through the heat sink and out through the prongs.

The processor P is mounted to the bottom surface 110 of the heat sink 102 (e.g., bottom plate 106) such that a large surface area of the processor is in direct contact with the bottom surface. By way of example, the processor P may be removably mounted to the heat sink bottom surface 110 with a mounting bracket 116 that is secured to the heat sink 102 with one or more fasteners 118, such as screws.

As is indicated in the figures, the heat dissipation apparatus 100 can further comprise one or more fan modules, such as an internal flow fan module 120 and an external flow fan module 122. Each of the fan modules 120, 122 includes one or more fans that are used to force air through or over the heat dissipation apparatus 100. For instance, as is shown in the end view of FIG. 5, the internal flow fan module 120 comprises two fans 124 that are used in parallel to generate airflow. Similarly, as shown in FIG. 1, the external flow fan module 122 comprises two fans 126 that are used in parallel.

Figure 6:
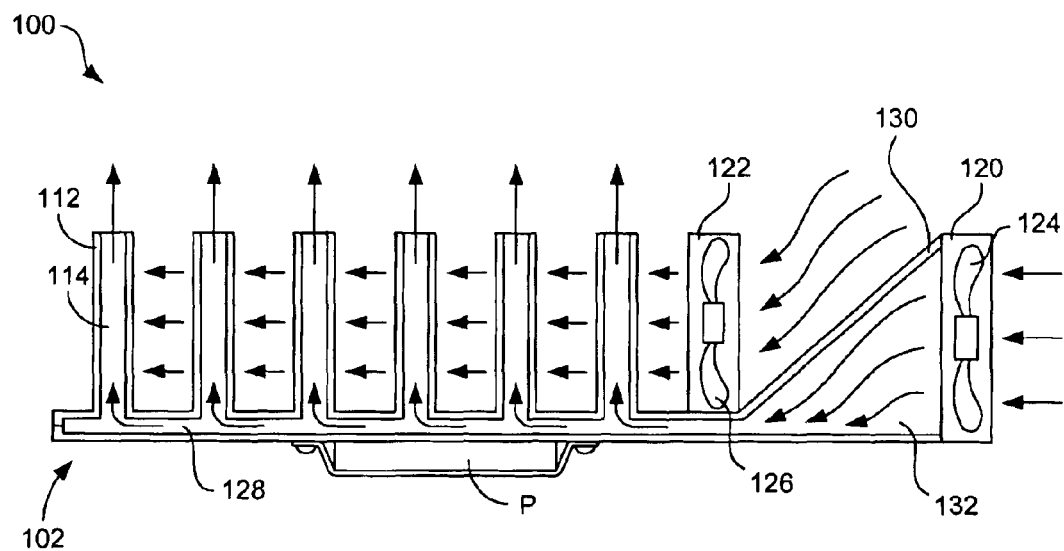
FIG. 6 is a schematic cross-sectional view of the heat dissipation apparatus of FIG. 1 taken along line 6—6 in FIG. 3 and illustrates fluid flow within and over the heat dissipation apparatus.

With reference next to the cross-sectional view of FIG. 6, the internal construction of the heat dissipation apparatus 100 will be discussed. As indicated in FIG. 6, airflow created by the internal flow fan module 120 is directed into an internal chamber 128 formed within the heat sink 102 with a flow director 130, such as a plate of material that includes two sides so as to define an inlet 132. The internal chamber 128 can be formed through a boring process in embodiments in which the heat sink 102 is a unitary member, or through machining of the top and bottom plates 104 and 106 in embodiments in which the heat sink is not unitary in construction. In either case, the internal chamber 128 is in fluid communication with the internal passages 114 of the prongs 112 such that air (or other fluid) that is forced into the internal chamber can flow out from the chamber through the prong passages. As is also indicated in FIG. 6, fluid (e.g., air) can be forced over the exterior surfaces of the prongs 112 using the external flow fan module 122

Operation of the heat dissipation apparatus will now be discussed in reference to FIG. 6. When a computer, for example a server, in which the heat dissipation apparatus 100 is used is powered, at some time during use of the computer the processor P is activated to perform various processing, and the fan modules 120, 122 are activated to spin their respective fans. The fans can be operated continuously, or intermittently during computer and/or processor use as necessary. As the fans spin, internal and external airflows are generated by the internal flow fan module 120 and the external fan module 122, respectively. With respect to the internal airflow, air is drawn into the fan(s) 124 of the internal flow fan module 120, is forced through the inlet 132, into the internal chamber 128 of the heat sink 102, through the internal passages 114 of the prongs 112, and out through the tops of the prongs, as indicated by various directional arrows. Therefore, heat that is generated by the processor P and transmitted into the heat sink 102 is transferred to the air flowing through the heat sink 102 and is removed through the prongs 112.

Simultaneous to the internal airflow, air is drawn into the fan(s) 126 of the external flow fan module 122 and is forced over the prongs 112 as is also indicated by directional arrows. Therefore, heat transmitted to the prongs 112 through their contact with the heat sink 102 is transferred to the air flowing over the prongs to further remove heat. Accordingly, heat is removed from internal and external surfaces of the heat dissipation apparatus 100 with the internal and external airflows. Due to the increased surface area that receives a forced airflow, increased heat transfer may be achieved and, therefore, the size and/or weight of the heat sink 102 may be decreased as compared to conventional heat sinks described in the foregoing.

Figure 7:
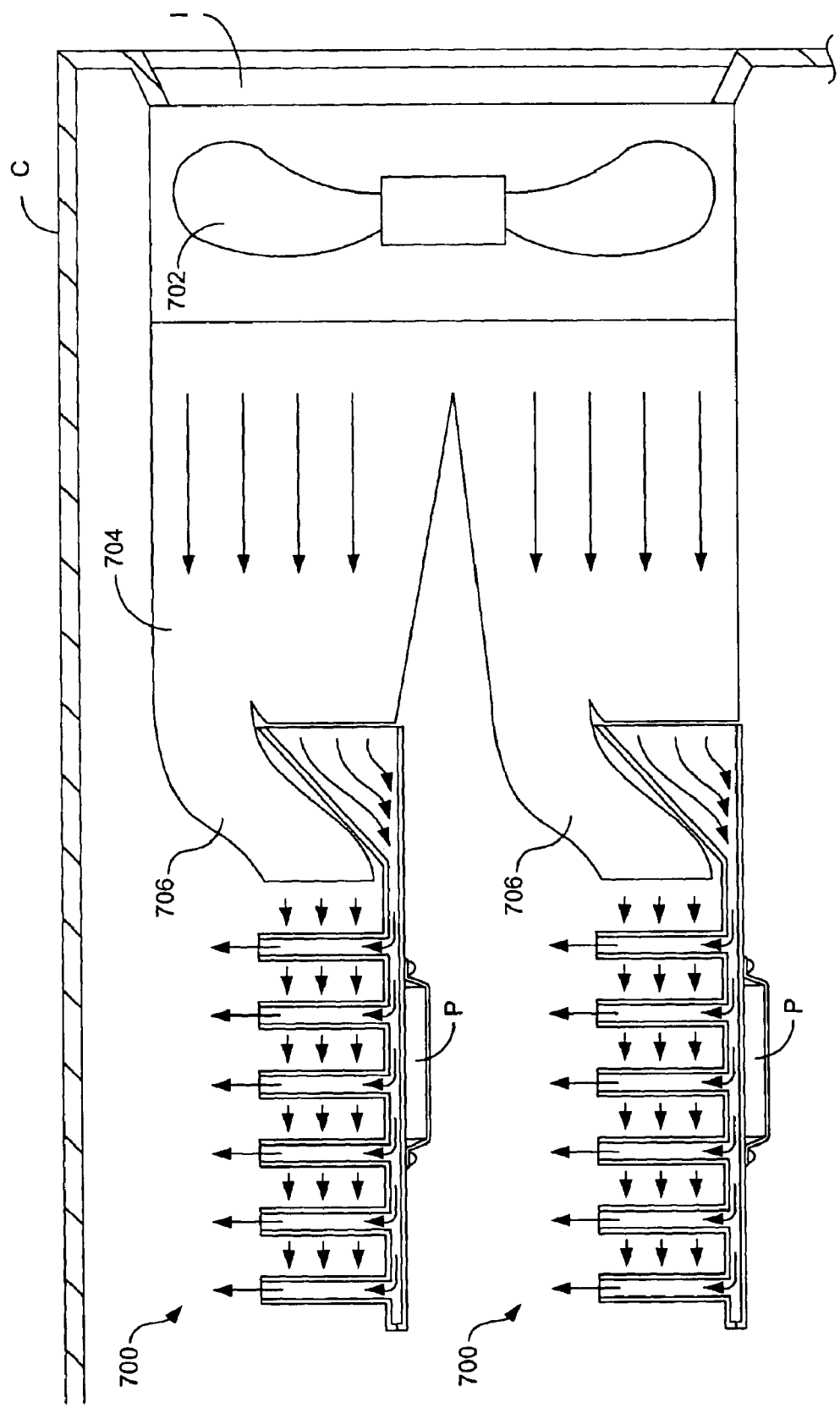
FIG. 7 is a schematic view of multiple heat dissipation apparatuses supplied with airflow by a separate fan of a computer.

In the embodiment described above in relation to FIGS. 1–6, the heat dissipation apparatus 100 includes its own integral internal and external flow fan modules. In other embodiments, however, the heat dissipation apparatus need not include such integral fan modules. Instead, the internal and external airflows can be generated by one or more separate fans and simply delivered to the heat dissipation apparatus. In such a case, a single fan or fan module can be used to provide airflow to two or more heat dissipation apparatuses. Such an arrangement is illustrated in FIG. 7. As shown in that figure, two heat dissipation apparatuses 700 are provided in a computer C (i.e. within the computer box). The heat dissipation apparatuses 700 are similar in construction to the heat dissipation apparatus 100 shown in FIGS. 1–6, but do not include integral fan modules. Instead, the heat dissipation apparatuses 700 are provided with airflow by a separate fan 702 of the computer C that is draws air into the computer through an inlet I of the computer box. As indicated in FIG. 7, an airflow director apparatus 704, which may include one or more conduits 706, is used to divide the airflow generated by the fan 702 into the internal and external airflows provided to the heat dissipation apparatuses 700. With such an arrangement, the size and/or weight of the apparatus used to dissipate heat from multiple processors may be reduced in that the number of fans used is reduced.

In each of the above-described embodiments, air may be drawn directly from the ambient air outside of the computer in which the heat dissipation device is provided so as to provide relatively cool air to the heat dissipating apparatus for the purpose of transferring heat. Alternatively, however, air (or other fluid) may be drawn from within the computer interior, if desired. In similar manner, air exhausted from a heat dissipation apparatus can be directly exhausted to the ambient air outside of the computer so as to remove heat from the computer interior. Alternatively, however, the air (or other fluid) may simply be exhausted to the computer interior and then removed from the computer with a separate apparatus (e.g., a separate computer exhaust fan).

Figure 8:
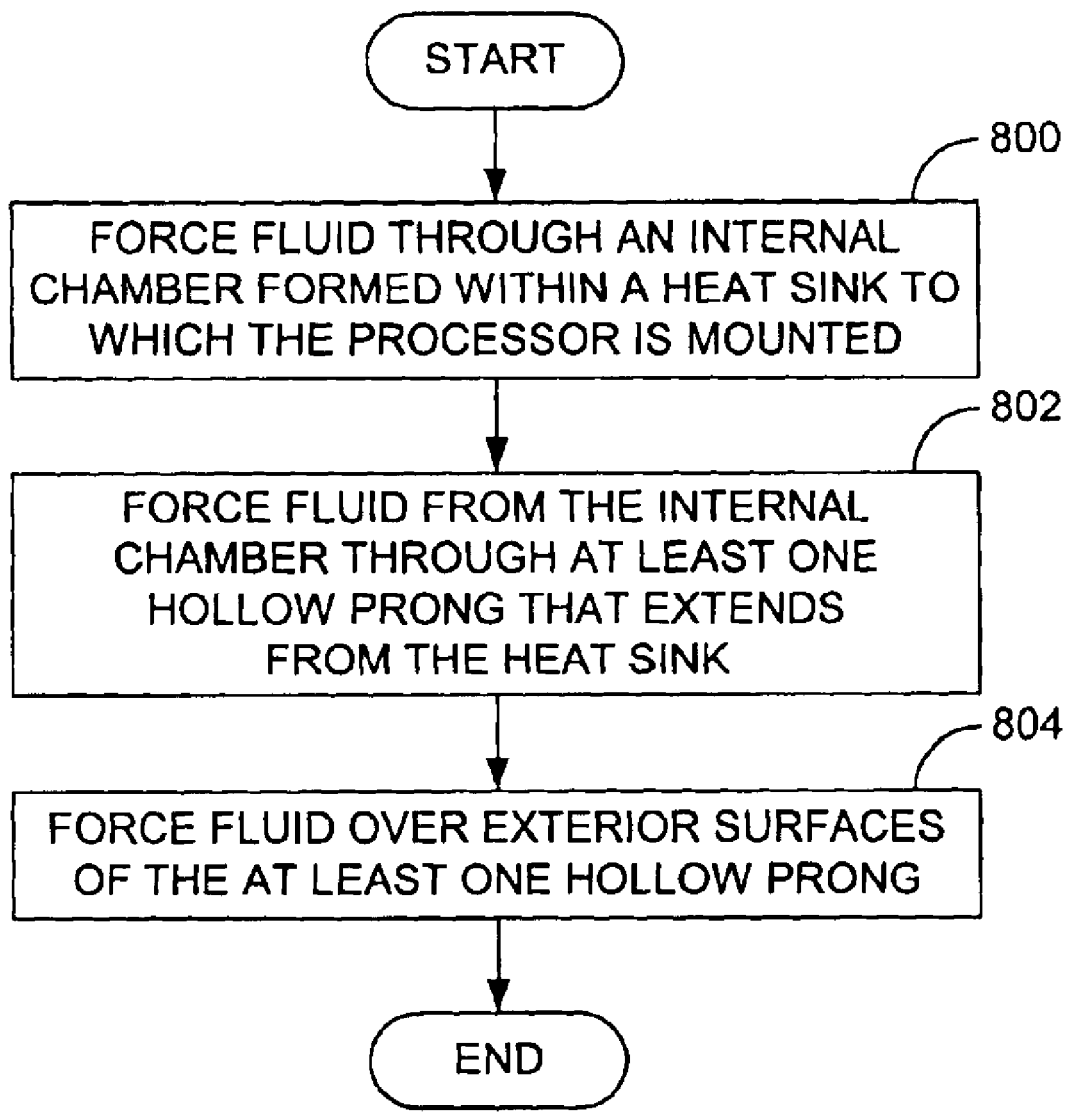
FIG. 8 is a flow diagram of an embodiment of a method for dissipating heat.

In view of the above, an embodiment of a method for dissipating heat from a processor can be summarized as indicated in the flow diagram of FIG. 8. Beginning with block 800 of that figure, fluid is forced through an internal chamber formed within a heat sink to which the processor is mounted. Next, in block 802, the fluid is forced from the internal chamber of the heat sink through at least one hollow prong that extends from the heat sink and that is in fluid communication with the internal chamber of the heat sink. Furthermore, as indicated in block 804, fluid is forced over exterior surfaces of the at least one hollow prong.

What is claimed is:

1. A heat dissipation apparatus, comprising:
   a heat sink that is adapted to receive a processor mounted thereto, the heat sink comprising an internal chamber that is adapted to receive a fluid flow that removes heat from the heat sink; and
   at least one external hollow prong that extends outwardly from the heat sink, the at least one external hollow prong being in fluid communication with the internal chamber of the heat sink such that fluid forced into the internal chamber flows through and out from the at least one external hollow prong.

2. The apparatus of claim 1, wherein the at least one external hollow prong comprises a cylindrical tube having an internal passage, the internal passage being in fluid communication with the internal chamber of the heat sink.

3. The apparatus of claim 2, wherein the heat sink comprises a top surface and wherein the at least one external hollow prong extends from the top surface of the heat sink.

4. The apparatus of claim 1, further comprising a fan that is positioned such that fluid forced from the fan flows over external surfaces of the at least one external hollow prong.

5. The apparatus of claim 4, wherein the fan is part of an external flow fan module that is mounted to the heat sink.

6. The apparatus of claim 1, further comprising an inlet that is in fluid communication with the internal chamber of the heat sink such that fluid forced into the inlet flows into the internal chamber.

7. The apparatus of claim 6, further comprising a fan that is in fluid communication with the inlet.

8. The apparatus of claim 6, wherein the fan comprises part of an internal flow fan module that is mounted to the heat sink.

9. The apparatus of claim 1, wherein the heat sink comprises a bottom surface that is adapted to receive a processor.

10. The apparatus of claim 1, wherein the heat sink comprises a top plate and a bottom plate that together form the internal chamber.

11. A heat dissipation apparatus, comprising:
    a heat sink that is adapted to receive a processor mounted thereto, the heat sink comprising an internal chamber;
    external hollow prongs that extend outwardly from the heat sink, the external hollow prongs being in fluid communication with the internal chamber of the heat sink; and
    an inlet that is in fluid communication with the internal chamber of the heat sink;
    wherein fluid forced into the inlet flows into the internal chamber of the heat sink and then through the external hollow prongs to exit the heat dissipation apparatus.

12. The apparatus of claim 11, wherein the heat sink comprises a top surface and a bottom surface, the external hollow prongs extending from the top surface and the bottom surface being adapted to receive a processor.

13. The apparatus of claim 12, further comprising an interior flow fan module that is in fluid communication with the inlet and mounted to the heat sink, the interior flow fan module being configured to force fluid into the inlet.

14. The apparatus of claim 13, further comprising an exterior flow fan module mounted to the top surface of the heat sink, the exterior flow fan module being configured to force fluid over exterior surfaces of the external hollow prongs.

15. The apparatus of claim 14, wherein the inlet is defined by a flow director that is positioned between the interior flow fan module and the exterior flow fan module.

16. A heat dissipation apparatus, comprising:
    means for transmitting heat away from a processor, the means comprising at least one external hollow prong;
    means for enabling flow of fluid through the means for transmitting heat away from a processor; and
    means for enabling flow of fluid over the means for transmitting heat away from a processor.

17. The apparatus of claim 16, wherein the means for transmitting heat comprise a heat sink.

18. The apparatus of claim 17, wherein the means for enabling flow of fluid through the means for transmitting heat comprise an internal chamber of the heat sink and an inlet that is in fluid communication with the internal chamber.

19. The apparatus of claim 18, wherein the means for enabling flow of fluid through the means for transmitting heat further comprise an internal flow fan module that is mounted to the heat sink and in fluid communication with the inlet.

20. The apparatus of claim 16, wherein the means for enabling flow of fluid through the means for transmitting heat comprise an internal passage of the at least one external hollow prong.

21. The apparatus of claim 20, wherein the means for enabling flow of fluid over the means for transmitting heat comprise an external flow fan module.

22. A method for dissipating heat generated by a processor, the method comprising:
    forcing fluid through an internal chamber formed within a heat sink to which the processor is mounted;
    forcing the fluid from the internal chamber of the heat sink through at least one external hollow prong that extends outwardly from the heat sink and that is in fluid communication with the internal chamber of the heat sink; and
    forcing fluid over exterior surfaces of the at least one external hollow prong.

23. The method of claim 22, wherein forcing fluid through an internal chamber comprises forcing air into the internal chamber using a fan module that is mounted to the heat sink.

24. The method of claim 22, wherein forcing fluid through an internal chamber comprises forcing air into the internal chamber using a fan that is separate from the heat sink.

25. The method of claim 22, wherein forcing fluid over exterior surfaces of the at least one external hollow prong comprises forcing air over the at least one external prong using a fan module that is mounted to the heat sink.

26. The method of claim 22, wherein forcing fluid over exterior surface of the at least one external hollow prong comprises forcing fluid over exterior surfaces of the at least one external hollow prong using a fan that is separate from the heat sink.

27. A computer, comprising:
    a processor; and
    a heat dissipation apparatus that includes a heat sink that is adapted to receive the processor, the heat sink comprising an internal chamber that is adapted to receive a fluid flow that removes heat from the heat sink, wherein the heat dissipation apparatus further comprises at least one hollow prong that extends from the heat sink, the at least one hollow prong being in fluid communication with the internal chamber of the heat sink such that fluid forced into the internal chamber flows through the at least one hollow prong.

28. The computer of claim 27, further comprising a fan that forces fluid over external surfaces of the at least one prong.

29. The computer of claim 28, wherein the fan is part of an external flow fan module that is mounted to the heat sink.

30. The computer of claim 27, wherein the heat dissipation apparatus further comprises an inlet that is in fluid communication with the internal chamber of the heat sink such that fluid forced into the inlet flows into the internal chamber.

31. The computer of claim 30, further comprising a fan that is in fluid communication with the inlet.

\* \* \* \* \*

UNITED STATES PATENT AND TRADEMARK OFFICE
CERTIFICATE OF CORRECTION

| | | |
|---|---|---|
| PATENT NO. | : 6,940,718 B2 | Page 1 of 1 |
| APPLICATION NO. | : 10/649551 | |
| DATED | : September 6, 2005 | |
| INVENTOR(S) | : Elias Gedamu et al. | |

It is certified that error appears in the above-identified patent and that said Letters Patent is hereby corrected as shown below:

In column 5, line 25, in Claim 3, delete "claim 2," and insert -- claim 1, --, therefor.

Signed and Sealed this

Eleventh Day of August, 2009

David J. Kappos
*Director of the United States Patent and Trademark Office*